United States Patent [19]
Okada

[11] Patent Number: 5,223,738
[45] Date of Patent: Jun. 29, 1993

[54] LEADFRAME

[75] Inventor: Makio Okada, Itami, Japan

[73] Assignee: Mitsubishi Denki Kabushiki Kaisha, Tokyo, Japan

[21] Appl. No.: 868,419

[22] Filed: Apr. 15, 1992

[30] Foreign Application Priority Data

Apr. 26, 1991 [JP] Japan .................. 3-96474

[51] Int. Cl.⁵ .............. H01L 23/48; H01L 23/28
[52] U.S. Cl. ................ 257/666; 257/668; 257/670; 257/674; 257/676
[58] Field of Search ......... 357/70, 68; 257/666, 257/668, 670, 674, 676

[56] References Cited

U.S. PATENT DOCUMENTS

| | | | |
|---|---|---|---|
| 4,477,827 | 10/1984 | Walker et al. | 357/72 |
| 4,496,965 | 1/1985 | Orcutt et al. | 357/80 |
| 4,868,635 | 9/1989 | Frechette et al. | 357/70 |
| 4,870,474 | 9/1989 | Karashima | 357/70 |
| 4,920,074 | 4/1990 | Shimizu et al. | 357/70 |
| 4,977,442 | 12/1990 | Suzuki et al. | 357/70 |
| 5,031,022 | 7/1991 | Yamamoto et al. | 357/72 |
| 5,057,901 | 10/1991 | Abel et al. | 357/70 |

FOREIGN PATENT DOCUMENTS 1165057 7/1991 Japan .

Primary Examiner—Eugene R. LaRoche
Assistant Examiner—Viet Q. Nguyen
Attorney, Agent, or Firm—Leydig, Voit & Mayer

[57] ABSTRACT

The present invention relates to a leadframe having slits around a semiconductor device forming area to absorb distortion or warpage of the leadframe because of the difference in the coefficients of thermal expansion of the leadframe and a sealing resin. The present invention is directed to limiting shifting of the outer leads caused by distortion or contraction of the leadframe and preventing cutting of the outer leads in a tie bar cutting process. To achieve these goals, positioning holes are provided on the inner portion of the leadframe in the vicinity of the tie bars at the three corners of the semiconductor device forming area but not at a corner where the resin injecting portion is located.

8 Claims, 2 Drawing Sheets

LEADFRAME

BACKGROUND OF THE INVENTION

1. Field of the Invention

The present invention relates to a leadframe used to manufacture semiconductor devices.

2. Description of the Related Art

FIGS. 3 and 4 show the configuration of a conventional leadframe.

FIG. 3 shows a single conventional leadframe. Normally, a plurality of leadframes are formed in a strip, as shown in FIG. 4. In FIGS. 3 and 4, a reference numeral 1 denotes a leadframe; 2, inner leads; 3, outer leads; 4, a die pad on which a semiconductor element (not shown) is mounted; 5, an outer frame portion of the leadframe 1; 6, hanging leads for connecting the die pad 4 to the outer frame portion 5; and 7, tie bars for preventing offset of the inner leads 2 and for preventing flow of a sealing resin to the outer leads 3 which are not packaged in the molding process.

A reference numeral 8 denotes first positioning holes used for positioning the leadframe 1 with respect to the molding mold, tie bar cutting mold and lead forming mold (these molds being not shown) employed in the molding process, tie bar cutting process and outer lead forming process, respectively. The positioning holes 8 are formed in the outer frame portion 5 of the leadframe 1 at fixed intervals. The first positioning holes 8 are in general circular or elliptical. A reference numeral 9 denotes a resin injecting portion corresponding to a sub runner and a gate (both being not shown) which act as the flow passage of the molding resin in a molding mold. In the resin injecting portion, a plate on which the sealing resin flows extends from the outer frame portion 5 toward the center of the leadframe. A line 10 indicates a sealing line which is the contour of a molded resin which packages the leadframe 1.

A line A in FIGS. 3 and 4 indicates a semiconductor device forming area including the inner leads 2, the outer leads 3, the die pad 4, the hanging leads 6 and the tie bars 7. A plurality of semiconductor device forming areas A are formed in series on a single leadframe strip 1, as shown in FIG. 4. A reference numeral 11 denotes slits for relieving distortion generated by the difference between the coefficient of thermal expansion between the leadframe 1 and of the molded resin when the molded resin is cooled from the molding temperature to room temperature, thereby preventing warpage of the semiconductor device caused by this distortion. The slits 11 are formed at the periphery of the semiconductor device forming areas A of the leadframe 1 except for the resin injecting portion 9, surrounding the semiconductor device forming area A.

To assemble semiconductor devices using the conventional leadframe 1 having the above-described configuration, a semiconductor element (a chip) is first bonded to the die pad 4 using a resin bonding agent or solder. Next, a large number of aluminum pad electrodes provided on the semiconductor element are respectively connected to the inner leads 2 using thin metal wires (not shown) made of gold, copper or aluminum. Thereafter, the leadframe 1 with the attached semiconductor elements thereon is placed in a mold (not shown), and a sealing resin is injected into the closed mold. After the sealing resin has cured, armor processing is performed on the leadframe 1 using a solder plating, and thereafter the tie bars 7 are cut using a tie bar cutting mold. Subsequently, the outer leads 3 are bent in a predetermined shape using a lead forming mold, and at the same time the distal ends of the outer leads 3 are separated from the outer frame portion 5 of the leadframe 1, thereby completing manufacture of semiconductor devices.

As the overall size of the semiconductor devices manufactured using the leadframe having the above-described configuration is increased, which has taken place in recent years, the degree of distortion caused by the difference in the coefficients of thermal expansion of the frame material and the resin is increased. Therefore, this distortion has not been absorbed by the slits 11 alone. This distortion increases warpage and contraction of the outer frame portion 5 of the leadframe 1 separated by the slits 11 and the entirety of the leadframe 1 even when a leadframe 1 provided with the slits is used to manufacture large semiconductor devices. Also, respective amounts of warpage and contraction generated in the central portion and end portion of the leadframe 1 vary. As a result, the positioning accuracy of the outer leads 3 deteriorates in the tie bar cutting process, because the first positioning holes 8 are located in the outer frame portion 5 separated from the rest of the leadframe by the slits 11. This position error may lead to erroneous cutting of the outer leads 3 during cutting of the tie bars 7.

SUMMARY OF THE INVENTION

Accordingly, an object of the present invention is to provide a leadframe in which the positioning of the outer leads 3 is not affected by warpage and contraction of the leadframe 1 to improve the positioning accuracy of the outer leads 3 in the tie bar cutting process and thereby prevent cutting of the outer leads 3 and improve reliability of the semiconductor device.

In order to achieve the above object, there is provided a leadframe used for the manufacture of semiconductor devices comprising a die pad on which a semiconductor element may be mounted, inner leads disposed around the die pad, outer leads, hanging leads supporting the die pad, tie bars connecting the outer leads and the hanging leads all disposed within a semiconductor device forming area of the leadframe; an outer frame integral with, supporting, and connected to the die pad and outer leads and disposed outside the semiconductor device forming area; a resin injecting portion extending from the outer frame portion toward the die pad for injecting a sealing resin; first positioning means for positioning the leadframe including a plurality of holes in the outer frame; and second positioning means in the vicinity of the tie bars and the outer leads for positioning the tie bars and the outer leads when the tie bars are cut.

In a leadframe according to the present invention, the outer leads can be positioned with a high degree of accuracy by means of the second positioning means provided in the vicinity of the outer leads during the tie bar cutting process. The second positioning means comprises positioning holes formed at three corners of a rectangle semiconductor device forming area in the vicinity of the tie bars but not at the fourth corner where resin injecting portion is disposed.

DETAILED DESCRIPTION OF THE PREFERRED EMBODIMENT

An embodiment of the present invention will now be described with reference to FIGS. 1 and 2.

Figure 1:
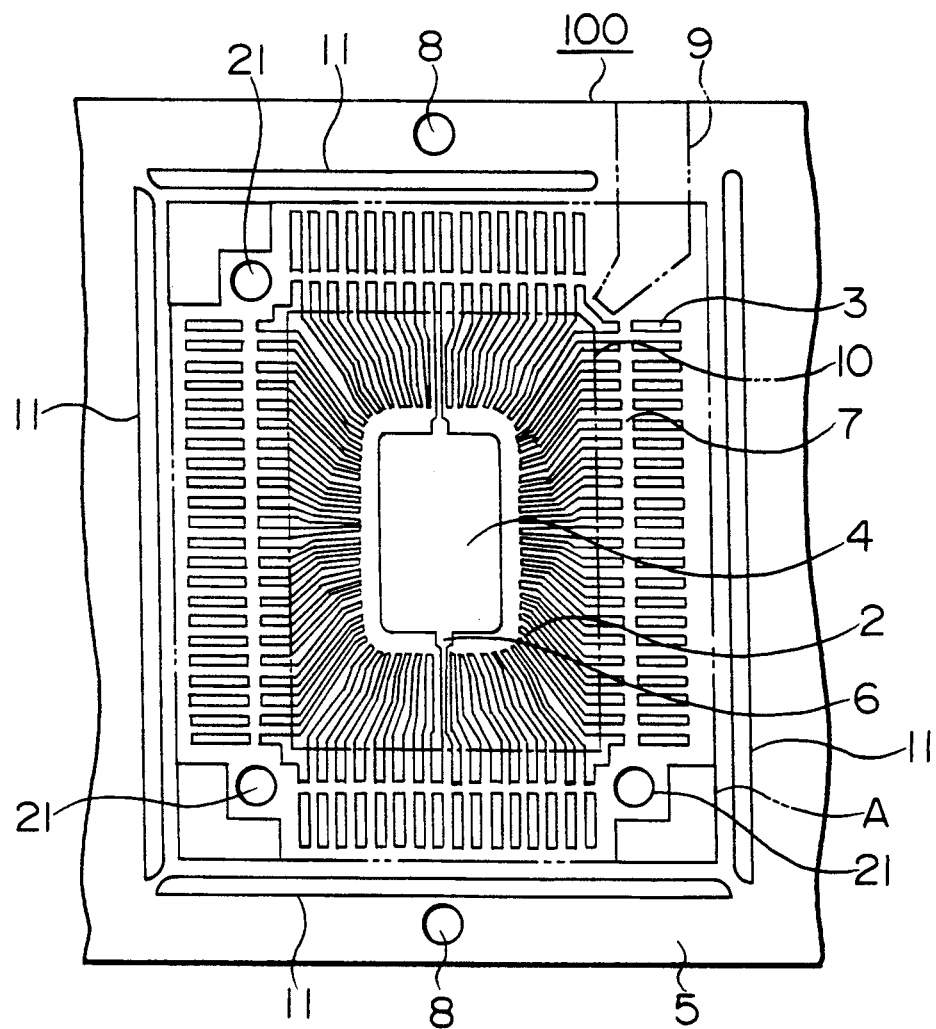
FIG. 1 is an enlarged and plan view of a single leadframe according to an embodiment of the present invention.
Figure 2:
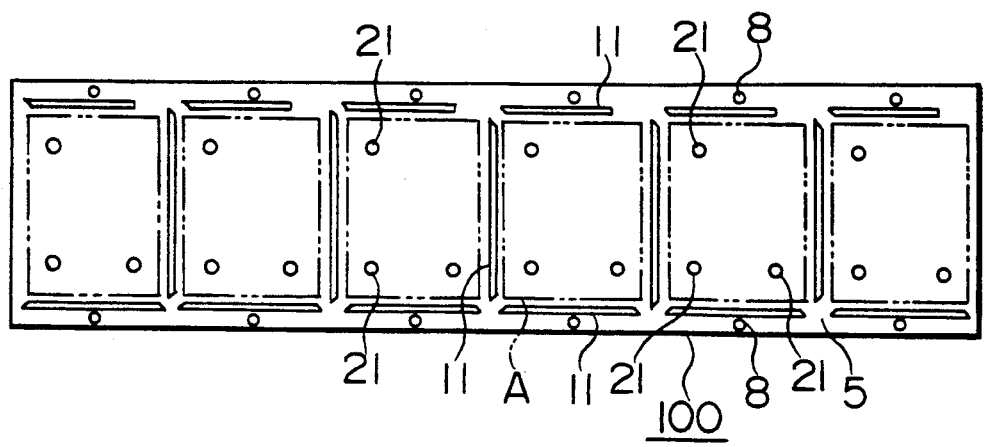
FIG. 2 is a plan view showing a plurality of leadframe of FIG. 1.
Figure 3:
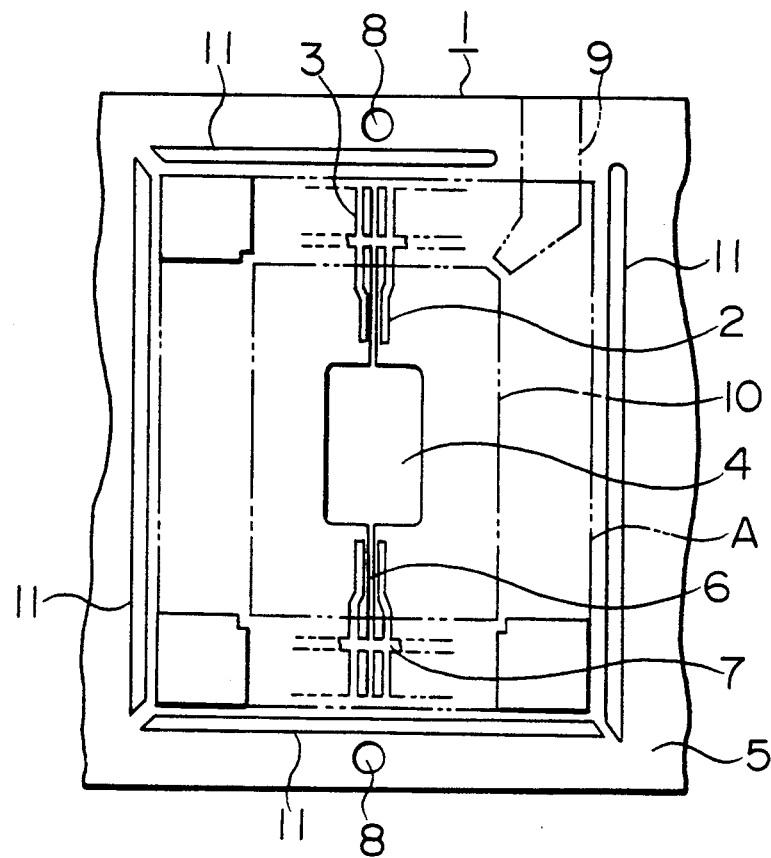
FIG. 3 is an enlarged and plan view of a conventional leadframe.
Figure 4:
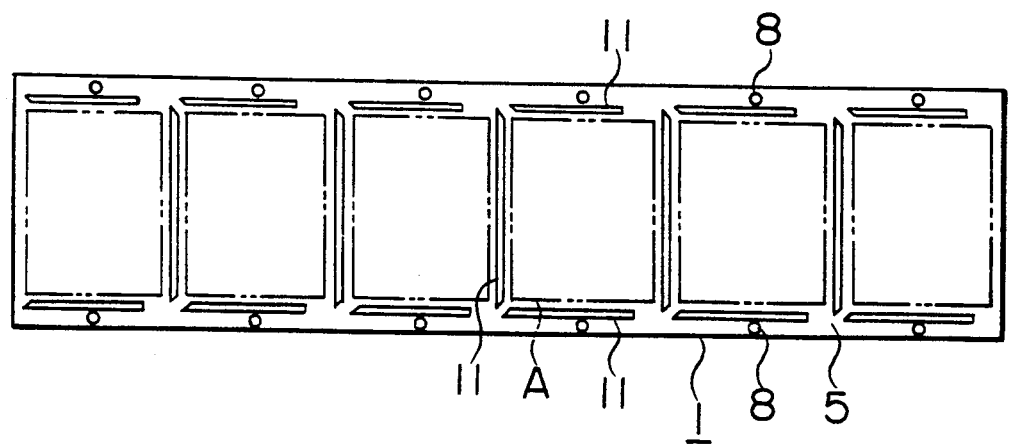
FIG. 4 is a plan view showing a plurality of leadframes of FIG. 3.

FIGS. 1 and 2 respectively show an embodiment of a leadframe 100 according to the present invention. FIG. 1 shows a single leadframe according to an embodiment of the present invention. Normally, a plurality of leadframes are attached in a strips as shown in FIG. 2. In FIGS. 1 and 2, the same reference numerals are used to denote parts and components which are the same as those shown in FIGS. 3 and 4, detailed description of the same parts being omitted.

In FIGS. 1 and 2, a reference numeral 21 denotes second positioning holes for positioning the leadframe 100, particularly, the semiconductor device forming area A in a tie bar cutting mold (not shown), during the tie bar 7 cutting process. The second positioning means includes second positioning holes. The three second positioning holes 21 are located at three corners of the semiconductor device forming area A but not at the corner where the resin injecting portion 9 is disposed in the vicinity of the tie bars 7 and outer leads 3. The three second positioning holes 21 are disposed at the same positions in each of the semiconductor device forming areas A. In this embodiment, the three positioning holes 21 are each located where extensions of a longitudinal tie bar 7 intersect extensions of the lateral tie bar 7. The positioning holes 21 are each, in general circular.

To assemble semiconductor devices using the leadframe 100 having the second positioning holes 21, the outer leads 3 are positioned using the positioning holes 21 and the tie bars 7 are cut using the tie bar cutting mold (not shown) in the tie bar cutting process. In the processes other than the tie bar cutting process, assembly is conducted in the conventional manner using the first positioning holes 8.

In the above embodiment, a leadframe with the slits 11 located around the semiconductor device forming area A have been described. However, the present invention can also be applied to a leadframe having no slits 11.

Furthermore, a leadframe having the slits around the semiconductor device forming area and having positioning holes located inside the slits, i.e., at three corners of the semiconductor device forming area A, i.e., not at the corner where the resin injecting portion is formed, is known. These positioning holes absorb shift and distortion of the semiconductor device forming area A with respect to the outer frame portion of the leadframe, generated by the formation of the slits. These positioning holes are used in the sealing resin molding process, tie bar cutting process and outer lead forming process. The positioning holes according to the present invention are particularly formed for the purpose of improving the positioning accuracy of the outer leads in the tie bar cutting process, and are used to absorb a shift of the semiconductor device forming area A with respect to the outer frame portion of the leadframe as well as shift and distortion of the inner portion located inside the tie bars 7 or the mold line 10 shown in FIGS. 1 and 2 with respect to the semiconductor device forming area A. That is, the positioning holes according to the present invention are apparently formed for the purposes different from those of the conventional ones.

As will be understood from the foregoing description, the leadframe according to the present invention has second positioning means comprising three positioning holes formed in the vicinity of the tie bars on three corners of a rectangular semiconductor device forming area except for the corner where the resin injecting portion is provided. In the tie bar cutting process, positioning between the tie bars and outer leads of the leadframe and the tie bar cutting mold is conducted using these positioning holes. Consequently, erroneous cutting of the outer leads is prevented, and a highly reliable semiconductor device is thus provided.

What is claimed is:

1. A leadframe used for the manufacture of semiconductor devices comprising:

a die pad for mounting a semiconductor element, inner leads disposed around said die pad, outer leads connected to respective inner leads, hanging leads supporting said die pad, tie bars connecting said outer leads and said hanging leads together, said die pad, inner leads, outer leads, hanging leads, and tie bars being disposed within a rectangular semiconductor device forming area of said leadframe, said semiconductor device forming area having four corners;

an outer frame integral with, supporting, and connected to said die pad and said outer leads and disposed outside said semiconductor device forming area;

a resin injecting portion disposed at one of the four corners of said semiconductor device forming area and extending from said outer frame toward said die pad for injecting a sealing resin;

first positioning means for positioning said leadframe, said positioning means including a plurality of holes in said outer frame; and second positioning means spaced from said hanging leads and said tie bars and located in the vicinity of said tie bars and said outer leads for positioning said tie bars and said outer leads for severing said tie bars.

2. The leadframe according to claim 1 wherein said second positioning means comprises three positioning holes respectively formed at three corners of said semiconductor device forming area in the vicinity of said tie bars, but not at the corner where said resin injecting portion is located.

3. The leadframe according to claim 2 wherein each of said positioning holes of said second positioning means is circular.

4. The leadframe according to claim 2 wherein each of said positioning holes is located at a respective intersection of extensions from said tie bars.

5. The leadframe according to claim 1 comprising a plurality of slits disposed outside said semiconductor device forming area in said outer frame, except at said resin injecting portion, surrounding said semiconductor device forming area.

6. The leadframe according to claim 5 wherein said second positioning means comprises three positioning holes respectively located at three corners of said semiconductor device forming area in the vicinity of said tie bars but not at the corner where said resin injecting portion is located.

7. The leadframe according to claim 6 wherein each of said positioning holes of said second positioning means is circular.

8. The leadframe according to claim 6 wherein each of said positioning holes is located at a respective intersection of extensions from said tie bars.

* * * * *